(12) United States Patent
Haupt et al.

(10) Patent No.: US 6,461,527 B1
(45) Date of Patent: Oct. 8, 2002

(54) METHOD FOR FABRICATING A FLEXIBLE PRINTED CIRCUIT BOARD WITH ACCESS ON BOTH SIDES

(75) Inventors: Detlef Haupt, Steinsberg; Frank Franzen, Badabbach, both of (DE)

(73) Assignee: Siemens Aktiengesellschaft, Munich (DE)

( * ) Notice: Subject to any disclaimer, the term of this patent is extended or adjusted under 35 U.S.C. 154(b) by 81 days.

(21) Appl. No.: 09/603,747

(22) Filed: Jun. 26, 2000

(30) Foreign Application Priority Data

Jun. 25, 1999 (DE) .......................... 199 29 179

(51) Int. Cl.⁷ ................................. H05K 3/00
(52) U.S. Cl. ............ 216/18; 216/19; 216/33; 216/17; 427/96; 427/97; 430/311
(58) Field of Search .............. 216/18, 19, 33, 216/17; 427/96, 97, 98, 99; 219/764, 770; 430/311

(56) References Cited

U.S. PATENT DOCUMENTS

| 5,347,712 | A | * | 9/1994 | Yasuda et al. ............... 29/852 |
| 5,357,131 | A | * | 10/1994 | Sunami et al. .............. 257/301 |
| 5,407,557 | A | * | 4/1995 | Iida et al. ................... 205/125 |
| 5,436,062 | A | * | 7/1995 | Schmidt et al. ............. 174/254 |
| 5,495,665 | A | * | 3/1996 | Carpenter et al. ............ 29/830 |
| 5,546,655 | A | * | 8/1996 | Feger et al. ................. 29/846 |
| 5,556,812 | A | * | 9/1996 | Leuschner et al. .......... 437/209 |
| 5,759,417 | A |   | 6/1998 | Inaba |
| 6,192,581 | B1 | * | 2/2001 | Tsukamoto .................. 29/852 |
| 6,240,636 | B1 | * | 6/2001 | Asai et al. ................... 29/852 |

FOREIGN PATENT DOCUMENTS

DE    1 925 745    10/1972

\* cited by examiner

Primary Examiner—Randy Gulakowski
Assistant Examiner—Jiri F. Smetana
(74) Attorney, Agent, or Firm—Laurence A. Greenberg; Werner H. Stemer; Ralph E. Locher

(57) ABSTRACT

A method for fabricating a flexible printed circuit board with access on both sides includes the steps of applying a metallic conductor track sheet to a base sheet and patterning the metallic conductor track sheet in order to produce conductor tracks. A conductor track covering with first contact-making cutouts is applied over the conductor tracks. Second contact-making cutouts are produced in the base sheet material by locally removing the base sheet through the use of laser irradiation. As an alternative, the first contact-making cutouts as well as the second contact-making cutouts can be produced by removing material with a laser.

18 Claims, 3 Drawing Sheets

METHOD FOR FABRICATING A FLEXIBLE PRINTED CIRCUIT BOARD WITH ACCESS ON BOTH SIDES

BACKGROUND OF THE INVENTION

Field of the Invention

The invention relates to a method for fabricating a flexible printed circuit board which has an access on both sides.

Flexible printed circuit boards or so-called "flexboards" are used as electrical connection elements and circuit carriers in a wide variety of technological areas.

The use of a cost-effective roll-to-roll process for producing flexible printed circuit boards with access on one side, i.e. with contact-making cutouts either only in the base sheet or only in the covering sheet, is already known. Base material, which is supplied in the form of a roll by the manufacturer of the base material and which includes a base sheet with a Cu sheet already applied thereto, is unwound continuously from the roll. The Cu sheet is patterned into conductor tracks and a covering sheet is rolled onto the patterned Cu sheet. The covering sheet is already provided with stamped-out portions at the contact-making locations that are to be formed subsequently. The material web thus fabricated is wound up onto a roll again at the end of the production line.

Printed circuit boards with access on both sides, i.e. with contact-making cutouts both, in the base sheet and in the covering sheet, cannot be fabricated in a roll-to-roll process, since this process, due to different expansion properties of the base material (base sheet with Cu sheet) and of the stamped covering sheet, does not have a sufficient positioning accuracy for the positionally highly accurate alignment of the stamped base film with the stamped covering film necessary in the case of a printed circuit board with access on both sides. For this reason, flexible printed circuit boards with access on both sides are not fabricated on a continuous material but rather in a comparatively cost-intensive method using individual-processing material sections or so-called "panels."

German Published, Prosecuted Patent Application DE-AS 19 25 745 discloses a method for fabricating, in a roll-to-roll process, a flexible printed circuit board with access on one side.

U.S. Pat. No. 5,759,417 discloses a process for fabricating a flexible printed circuit board which has access openings on both sides. In this case, a base material which is in the form of a sheet and which is coated on both sides with Cu is used. A conductor track pattern is formed from one of the Cu layers, while fine holes are introduced into the other Cu layer at suitable locations through the use of a photolithographic step. The conductor track pattern formed from the first Cu layer is covered with a covering sheet having stamped-out portions at suitable locations. On the other side of the printed circuit board, the perforated Cu layer is used as a mask layer for a laser processing step, in which contact-making holes are burned into the base material. Access to the Cu layer forming the conductor track pattern is also enabled via the contact-making holes. The Cu mask layer is removed in a final step.

SUMMARY OF THE INVENTION

It is accordingly an object of the invention to provide a method for fabricating a flexible printed circuit board with access on both sides which overcomes the above-mentioned disadvantages of the heretofore-known methods of this general type and which is cost-effective to carry out and allows a high flexibility in the process control.

With the foregoing and other objects in view there is provided, in accordance with the invention, a method for fabricating a flexible printed circuit board, which includes the steps of:

providing a base material having a base sheet and a metallic conductor track sheet disposed on the base sheet;

patterning the metallic conductor track sheet for producing conductor tracks;

providing a conductor track covering over the conductor tracks and providing a first contact-making cutout in the conductor track covering;

producing a second contact-making cutout in the base sheet with a laser irradiation by guiding, with an optical configuration, a beam of a laser, focused to a small-area laser light spot, along a predefined travel path across the base sheet and removing the base sheet in a region of the second contact-making cutout; and performing the steps of patterning the metallic conductor track sheet, providing the conductor track covering, and producing the second contact-making cutout in at least one roll-to-roll process.

In other words, in accordance with the invention, a method for fabricating a flexible printed circuit board is provided, in which, on a base material including a base sheet and a metallic conductor track sheet provided thereon, in one or more roll-to-roll processes, the conductor track sheet is patterned for the purpose of producing conductor tracks, and a conductor track covering, in particular a covering sheet, is provided over the conductor tracks, first contact-making cutouts being provided in the conductor track covering, wherein the method is characterized in that in the context of a roll-to-roll process, using laser irradiation, second contact-making cutouts are produced in the base sheet, by a laser beam, focused in a small-area, being guided by an optical configuration along a predefined travel path across the base sheet to be removed in the region of the second contact-making cutout to be produced.

With the objects of the invention in view there is also provided, a method for fabricating a flexible printed circuit board, which includes the steps of:

providing a base material having a base sheet and a metallic conductor track sheet disposed on the base sheet;

patterning the metallic conductor track sheet for producing conductor tracks;

providing a conductor track covering over the conductor tracks;

producing a first contact-making cutout in the conductor track covering and producing a second contact-making cutout in the base sheet with a laser irradiation by in each case guiding, with an optical configuration, a beam of a laser, focused to a small-area laser light spot, along a predefined travel path across the base sheet and the conductor track covering and removing the base sheet and the conductor track covering in regions of the first and second contact-making cutouts; and performing the steps of patterning the metallic conductor track sheet, providing the conductor track covering, and producing the first and second contact-making cutouts in at least one roll-to-roll process.

A significant advantage of both methods according to the invention is that a cost-effective roll-to-roll process is used in the production of the flexible printed circuit board with access on both sides. The integration of the laser processing step into the roll-to-roll process, which uses a continuous material web, results in a maximum cost saving, since all the first and second contact-making cutouts in the printed circuit board layer structure have already been completed at the end of the cost-effective roll-to-roll process. Furthermore, in comparison with conventional methods which use a mechanical stamping step in order to form the second contact-making cutouts, both methods according to the invention have a high adaptability—which can be achieved in particular by the use of software—with regard to changes in the process configuration or process planning. Whereas a change in the desired stamping positions or patterns necessitates an exchange of parts of e.g. the stamping tool in the case of a conventional stamping process. In the case of the methods according to the invention on the other hand, only laser and/or laser positioning parameters have to be adjusted by software in such a case.

In accordance with the first method according to the invention, the laser processing step is preferably carried out after the application of the conductor track covering containing the first contact-making cutouts. In this case, it is appropriate to perform the process steps of patterning the conductor track sheet and providing or applying the conductor track covering, in a roll-to-roll process, on a continuous material web.

In accordance with the second method according to the invention, a laser processing step is used both, to produce the first contact-making cutouts and to produce the second contact-making cutouts. As in the case of the first method according to the invention, the two laser processing steps are carried out (if appropriate at different process instants) in the context of a roll-to-roll process in this case, too.

The effect achieved by guiding the laser beam, which is focused in a small area, along a predefined travel path is that only material in a small area is removed at each instant. As a result, the risk of damage to the base sheet material (conductor track covering material) is reduced, and the material is removed in a highly defined manner with good lateral control.

The laser preferably produces a light spot having a diameter in the range of 100–300μm on the base sheet and, in the case of the second method, also on the conductor track covering.

A further preferred measure of the invention is characterized in that the light spot of the laser sweeps over the base sheet to be removed, and, if appropriate, also over the conductor track covering, with a velocity in the range of 10–50 cm/s, in particular about 20 cm/s. This ensures that, on the one hand, a sufficiently rapid production of the second contact-making cutouts and, if appropriate, also the first contact-making cutouts is achieved. On the other hand, the metallic conductor track sheet cannot be damaged by the laser light radiation being coupled in at the same location for an excessively long period of time.

Likewise, for reasons of affording protection against damage, the base sheet, if appropriate also the conductor track covering, is removed in layers in the region of the second contact-making cutout and, if appropriate, also in the region of the first contact-making cutout to be uncovered, by being swept over repeatedly, in particular from 2 to 4 times, by the laser light spot.

On accordance with another mode of the invention, the laser light spot is guided along a spiral travel path or a meandering travel path across the conductor track covering for producing the first contact-making cutout.

On accordance with a further mode of the invention, the laser light spot is guided along a spiral travel path or a meandering travel path across the base sheet for producing the second contact-making cutout.

Other features which are considered as characteristic for the invention are set forth in the appended claims.

Although the invention is illustrated and described herein as embodied in a method for fabricating a flexible printed circuit board with access on both sides, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings in detail and first, particularly, to FIGS. 1a–c and 2a–c thereof, there is illustrated a sequence according to the invention for fabricating a flexible printed circuit board with access on both sides in accordance with the first method according to the invention. In this case, the process sequence explained with reference to FIGS. 1a–c differs from the process sequence explained with reference to FIGS. 2a–c merely by the use of different base materials.

Figure 1A:
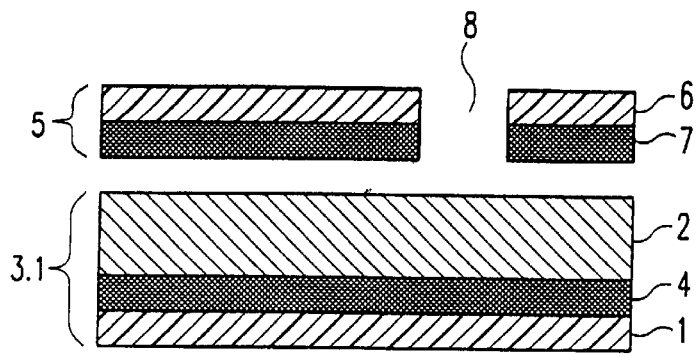
FIG. 1a is a sectional view of a layer sequence of a flexible printed circuit board before a conductor track covering is attached to a base material.
Figure 1B:
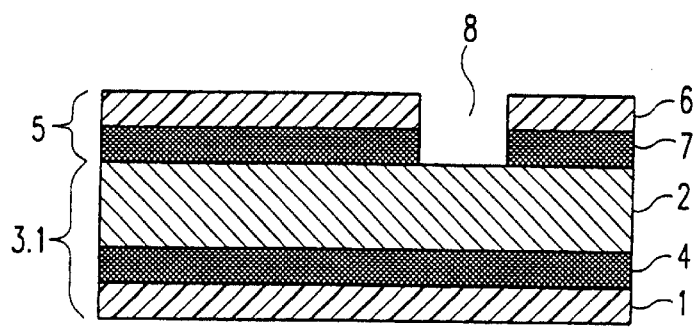
FIG. 1b is a sectional view of the layer sequence shown in FIG. 1a after the conductor track covering has been attached to the base material.
Figure 1C:
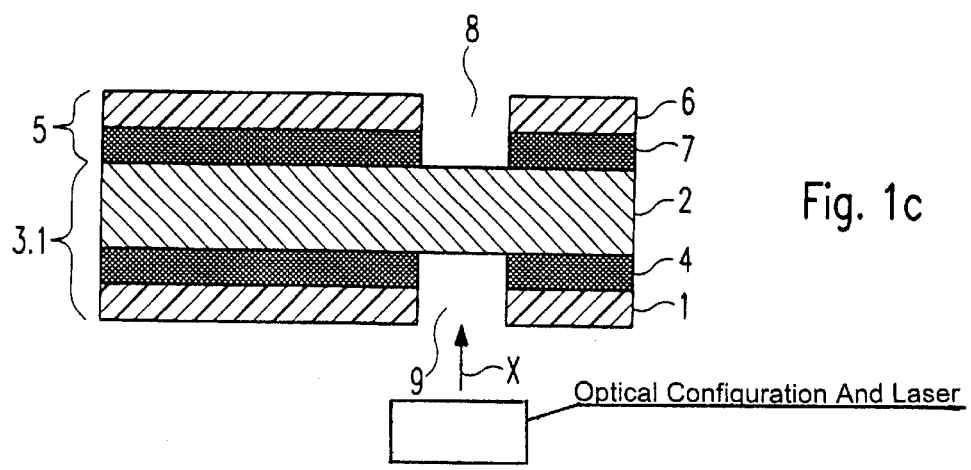
FIG. 1c is a sectional view of the layer sequence shown in FIG. 1b after the laser processing step.

In accordance with FIGS. 1a–c, the base material 3.1 includes a thin plastic base sheet 1, a metallic conductor track sheet 2 and an adhesive layer 4 provided between the base sheet 1 and the conductor track sheet 2.

The base sheet 1 may be composed for example of polyester, polyimide or "TEFLON". A thin Cu sheet, having a thickness of for example 17.5 μm, 35μm or 70μm, is usually used as the conductor track sheet 2. However, it is also possible to use conductor track sheets 2 up to a thickness of about 250μm.

Figure 2A:
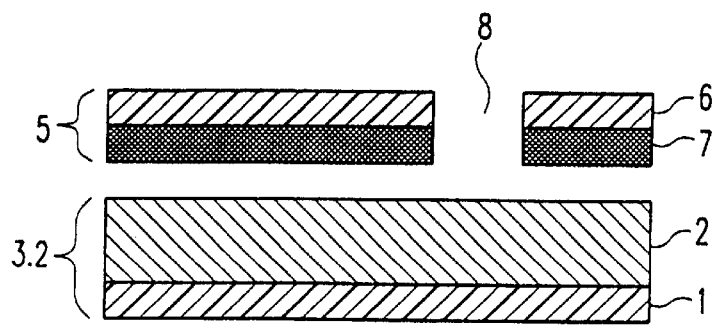
FIG. 2a is a sectional view of a further layer sequence of a flexible printed circuit board before a conductor track covering is attached to a base material.
Figure 2B:
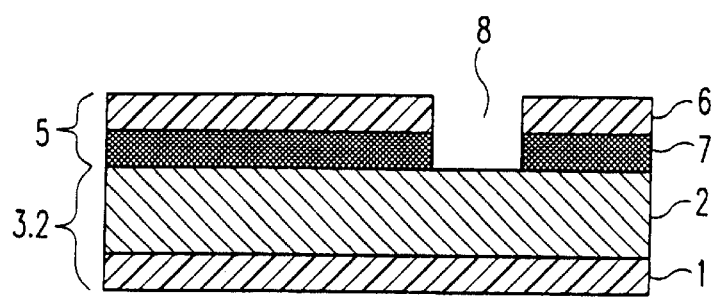
FIG. 2b is a sectional view of the layer sequence shown in FIG. 2a after the conductor track covering has been attached to the base material.
Figure 2C:
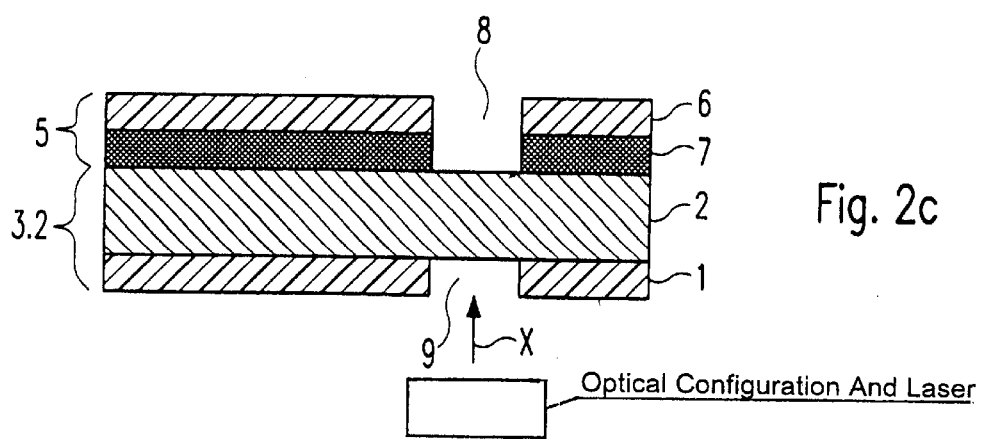
FIG. 2c is a sectional view of the layer sequence shown in FIG. 2b after the laser processing step.

In accordance with FIGS. 2a–c, the base material 3.2 may also be constructed without an intermediate adhesive layer 4.

In terms of production engineering, the base material 3.1 or 3.2 is produced either by electrolytic deposition (electrodeposition) of the conductor track sheet metal on the base sheet 1 or by the conductor track sheet 2 being rolled onto the base sheet 1 which, if appropriate, has been provided with the adhesive layer 4 beforehand. In both cases, a continuous web of the base material is fabricated which can be wound up to form a roll for further handling or for transportation purposes.

In a subsequent production step, the conductor track sheet 2 is patterned or structured, i.e. the conductor track pattern is formed from it. This step is likewise carried out on the continuous material, i.e. either in the roll-to-roll process described above or in a roll-to-roll process to be carried out at a later point in time and, if appropriate, at a different location. To that end, the conductor track sheet 2 is firstly cleaned chemically. A photoresist is bonded onto the conductor track sheet 2. The photoresist is exposed through the use of a photographic film, in other words a so-called photoprinting process is performed. Tracks are formed from the conductor track sheet 2 by an etching step and the photoresist is removed.

A conductor track covering is applied onto the patterned conductor track sheet 2 in a subsequent process step. The conductor track covering may be realized by a covering material 5 including a thin plastic covering sheet 6 (e.g. made of polyester, polyimide or "TEFLON") and an optional adhesive layer 7 provided on the lower surface —facing the base material 3.1, 3.2—of the covering sheet. The adhesive layer 7 is composed for example of an acrylic or epoxide material.

Before the covering material 5 is stuck to the base material 3.1, 3.2, first contact-making cutouts 8 are introduced into the covering material 5 through the use of a stamping step. The cutouts allow an access from above when the flexible printed circuit board or flexboard has been completed. The stamping step is likewise carried out on the continuous covering material 5 using a roll-to-roll process.

The stamped, continuous covering material 5 is subsequently laminated onto the continuous base material 3.1 (see FIG. 1b) or 3.2 (see FIG. 2b) while pressure and heat is applied.

As an alternative to the application of the covering material 5, the conductor track covering may also be fabricated through the use of a covering resist which is applied to the patterned conductor tracks 2 by a screen printing method. This process can also be performed on the continuous material, i.e. by using a roll-to-roll process.

In order to realize the access on the underside, the invention uses a laser processing step, as is illustrated in FIGS. 1c and 2c. FIGS. 1c and 2c schematically show a laser together with an optical configuration for guiding the laser beam. According to the invention, the laser processing step is also performed on the continuous material web, i.e. in the context of the roll-to-roll process. For this purpose, one or more lasers, preferably Nd:YAG lasers are integrated in the roll-to-roll production station and provided in such a way that they can irradiate the base sheet 1 of the material web 5, 3.1 or 5, 3.2 that is being produced, in accordance with the arrow X.

The laser beam is directed at those locations on the base sheet 1 where the second contact-making cutouts 9 are to be formed. As a result of the laser irradiation, the base sheet material 1 (see FIG. 2c) or the base sheet material 1 with the adhesive layer 4 (see FIG. 1c) is locally heated and vaporized.

Use is preferably made of a focused laser beam with a small-area light spot having a diameter in the range of 100–300μm, which is guided through the use of a beam optical configuration along a predefined travel path across the base material 1, (4) to be removed. The velocity with which the light spot is guided across the base material 1, (4) must be high enough that, on the one hand, the highest possible production rate can be achieved and, on the other hand, heat input takes place only momentarily at the same location. It has also proved to be expedient for the base material 1, (4) to be removed in layers by being scanned repeatedly, for example from 2 to 4 times, in the region of a second contact-making cutout 9. As a result, the effect that can be achieved by the abovementioned measures and by a suitable setting of the laser parameters is that, during the irradiation step, on the one hand enough energy is coupled in to ensure that the base sheet 1 (if appropriate with adhesive layer 4) is completely removed in the region of the second contact-making cutouts 9 to be uncovered, but that on the other hand the energy that is radiated in is not so high that the uncovered conductor track sheet 2 is melted in the process or is damaged in some other way.

Furthermore, regions of the base material 1, (4) in which material removal is not intended should not to be damaged by the laser processing step. The abovementioned measures and the optional use of optical recognition systems for positioning the laser beam ensure that the material removal is effected in a highly defined manner and with good lateral control.

Figure 3A:
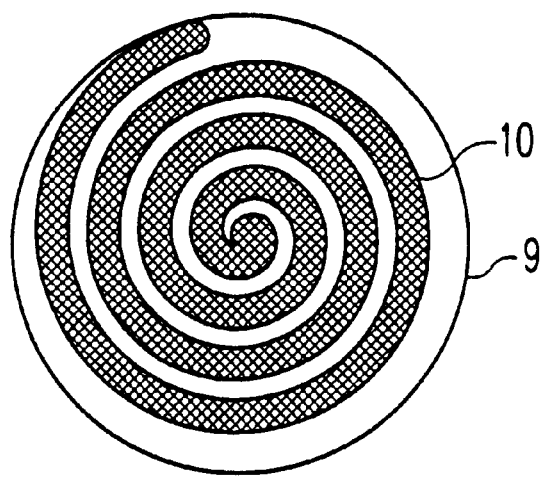
FIG. 3a is a diagrammatic plan view of a spiral material removal path.
Figure 3B:
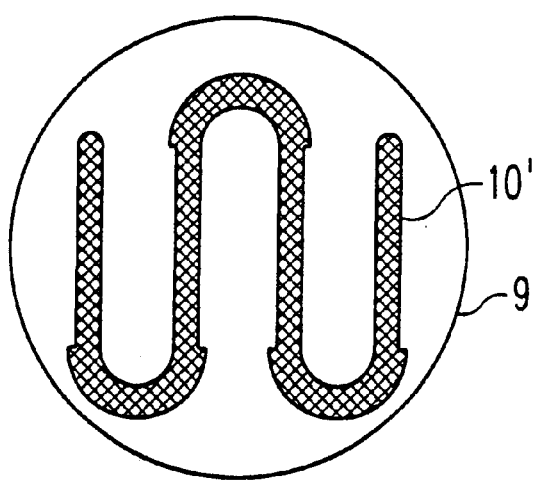
FIG. 3b is a diagrammatic plan view of a meandering material removal path.

FIGS. 3a and 3b show, in a plan view, two possibilities for a diagrammatically illustrated material removal path 10, 10' (spiral and meandering) for guiding the laser light spot across the base sheet 1 in the region of a second contact-making cutout 9 to be uncovered.

After the second contact-making cutouts 9 have been produced, the uncovered conductor track regions can be covered by an organic material in order to prevent their metallic surface from being tarnished. This method step can also be performed in a roll-to-roll process.

For a further processing, the material web is then separated into individual-processing material sections or panels. The following work steps are carried out separately on each individual panel or material section. They include the construction or fabrication of metallic contact areas in the region of the first and second contact-making cutouts 8, 9 through the use of a metallic coating step (tin-plating) and mechanical processing steps such as, for example, the drilling of component holes and the like.

In a final dividing step, a multiplicity of flexible printed circuit boards or flexboards are cut out from each panel by contour stamping.

The individual printed circuit boards may then optionally be laminated onto reinforcement structures. Finally, electronic components are mounted on the individual flexboards.

The production sequence explained by way of example above can be carried out in a markedly cost-effective manner, since the laser processing step is performed in a roll-to-roll process.

An exemplary embodiment of the second method according to the invention differs from the exemplary embodiment described above essentially only by the fact that the first contact-making cutouts 8 in the conductor track covering 5 are also realized through the use of a laser vaporization process. In this case a continuous covering sheet 6 without the stamped first contact-making cutouts 8 or a continuous covering resist layer can be applied to the base material 3.1 or 3.2 as the conductor track covering 5.

We claim:

1. A method for fabricating a flexible printed circuit board, the method which comprises:
   providing a base material having a base sheet and a metallic conductor track sheet disposed on the base sheet; and
   conducting at least a roll-to-roll process by:
      patterning the metallic conductor track sheet for producing conductor tracks;
      providing a conductor track covering over the conductor tracks, the conductor track covering having a first contact-making cutout; and
      producing a second contact-making cutout in the base sheet with a laser irradiation by guiding, with an optical configuration, a beam of a laser, focused to a laser light spot area, along a predefined travel path across the base sheet and removing the base sheet in a region of the second contact-making cutout.

2. The method according to claim 1, which comprises providing a covering sheet as the conductor track covering.

3. The method according to claim 1, which comprises producing, with the laser, the laser light spot with a diameter of between 100 µm and 300 µm on the base sheet.

4. The method according to claim 1, which comprises sweeping the laser light spot over the base sheet to be removed with a velocity of between 10 cm/s and 50 cm/s.

5. The method according to claim 1, which comprises sweeping the laser light spot over the base sheet to be removed with a velocity of substantially 20 cm/s.

6. The method according to claim 1, which comprises removing the base sheet in layers in the region of the second contact-making cutout to be uncovered by sweeping the laser light spot repeatedly over the region of the second contact-making cutout.

7. The method according to claim 1, which comprises removing the base sheet in layers in the region of the second contact-making cutout to be uncovered by sweeping the laser light spot two to four times over the region of the second contact-making cutout.

8. The method according to claim 1, which comprises guiding the laser light spot along a spiral travel path across the base sheet for producing the second contact-making cutout.

9. The method according to claim 1, which comprises guiding the laser light spot along a meandering travel path across the base sheet for producing the second contact-making cutout.

10. A method for fabricating a flexible printed circuit board, the method which comprises:
    providing a base material having a base sheet and a metallic conductor track sheet disposed on the base sheet; and
    conducting at least a roll-to-roll process by:
       patterning the metallic conductor track sheet for producing conductor tracks;
       providing a conductor track covering over the conductor tracks;
       producing a first contact-making cutout in the conductor track covering and producing a second contact-making cutout in the base sheet with a laser irradiation by in each case guiding, with an optical configuration, a beam of a laser, focused to a laser light spot area, along a predefined travel path across the base sheet and the conductor track covering and removing the base sheet and the conductor track covering in regions of the first and second contact-making cutout.

11. The method according to claim 10, which comprises providing a covering sheet as the conductor track covering.

12. The method according to claim 10, which comprises producing, with the laser, the laser light spot with a diameter of between 100 µm and 300 µm on at least one of the base sheet and the conductor track covering.

13. The method according to claim 10, which comprises sweeping the laser light spot over at least one of the base sheet and the conductor track covering to be removed with a velocity of between 10 cm/s and 50 cm/s.

14. The method according to claim 10, which comprises sweeping the laser light spot over at least one of the base sheet and the conductor track covering to be removed with a velocity of substantially 20 cm/s.

15. The method according to claim 10, which comprises removing at least one of the base sheet and the conductor track covering in layers in the regions of the first and second contact-making cutouts to be uncovered by sweeping the laser light spot repeatedly over at least one of the regions of the first and second contact-making cutouts.

16. The method according to claim 10, which comprises removing at least one of the base sheet and the conductor track covering in layers in the regions of the first and second contact-making cutouts to be uncovered by sweeping the laser light spot two to four times over at least one of the regions of the first and second contact-making cutouts.

17. The method according to claim 10, which comprises guiding the laser light spot along one of a spiral travel path and a meandering travel path across the conductor track covering for producing the first contact-making cutout.

18. The method according to claim 10, which comprises guiding the laser light spot along one of a spiral travel path and a meandering travel path across the base sheet for producing the second contact-making cutout.

* * * * *